US009699558B2

(12) United States Patent
Jones et al.

(10) Patent No.: US 9,699,558 B2
(45) Date of Patent: Jul. 4, 2017

(54) CREATION OF SUB-SAMPLE DELAYS IN DIGITAL AUDIO

(71) Applicant: Apple Inc., Cupertino, CA (US)

(72) Inventors: Girault W. Jones, Los Gatos, CA (US); Nathan A. Johanningsmeier, San Jose, CA (US); Martin E. Johnson, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 67 days.

(21) Appl. No.: 13/712,327

(22) Filed: Dec. 12, 2012

(65) Prior Publication Data

US 2014/0161279 A1 Jun. 12, 2014

(51) Int. Cl.

*H04R 1/40* (2006.01)
*H03M 1/66* (2006.01)
*H04R 3/12* (2006.01)
*H04S 3/00* (2006.01)

(52) U.S. Cl.

CPC ............... *H04R 3/12* (2013.01); *H04S 3/008* (2013.01)

(58) Field of Classification Search

CPC .................................. H04R 3/12; H04S 3/008
See application file for complete search history.

(56) References Cited

U.S. PATENT DOCUMENTS

| | | | | |
|---|---|---|---|---|
| 4,211,997 | A | 7/1980 | Rudnick et al. | |
| 5,204,909 | A | 4/1993 | Cowan | |
| 5,682,114 | A | 10/1997 | Ohta | |
| 7,894,609 | B2 | 2/2011 | Heinsen | |
| 8,198,941 | B2 | 6/2012 | Lesso | |
| 2004/0087294 | A1 | 5/2004 | Wang | |
| 2010/0329482 | A1* | 12/2010 | Lee | 381/104 |

OTHER PUBLICATIONS

"Bucket Brigade Delay Line for Analogue Signals", TDA1022, Jun. 1976, Internet document at: www.classiccmp.org/rtellason/chipdata/tda1022.pdf, (10 pages).
"Digital Audio Resampling Home Page", Admitted Prior Art, Internet document at: https://ccrma.stanford.edu/~jos/resample/, (pp. 1-19).
Harris, Fredric J., "Multirate Digital Filters for Symbol Timing Synchronization in Software Defined Radios", IEEE Journal on Selected Areas in Communications, vol. 19, No. 12, Dec. 2001, (pp. 2346-2357).

(Continued)

*Primary Examiner* — Regina N Holder
(74) *Attorney, Agent, or Firm* — Blakely, Sokoloff, Taylor & Zafman LLP

(57) ABSTRACT

A multi-channel audio system that can provide a variable sub-sample delay between two or more audio channels. In one embodiment, a variable timing clock generator generates multiple clock signals where each may have different phase, and the clock generator can vary the phase difference, in accordance with a sub-sample delay setting input. These clock signals are used by respective digital-to-analog converters (DACs) to convert the digital audio channels into analog form. In another embodiment, a variable delay block is added to an oversampling DAC, on a per channel basis. Other embodiments are also described and claimed.

43 Claims, 3 Drawing Sheets

(56) References Cited

OTHER PUBLICATIONS

Hermanowicz, Ewa, "Digital Filter for Quadrature Sub-Sample Delay Estimation", 15th European Signal Processing Conference (EUSIPCO 2007), Poznan, Poland, Sep. 3-7, 2007 copyright by EURASIP, (pp. 1053-1057).

Janssen, E., et al., "Chapter 2—Basics of Sigma-Delta Modulation", Look-Ahead Based Sigma-Delta Modulation, Analog Circuits and Signal Processing, Springer Science+Business Media B.V. 2011, DOI: 10.1007/978-94-007-1387-1_2 [2011, XII, 247 p. 147 illus., Hardcover—ISBN: 978-94-007-1386-4], (pp. 5-28, plus 1 cite page).

Kite, Ph.D., Thomas, "Understanding PDM Digital Audio", Audio Precision, Copyright 2012, Beaverton, Oregon USA, (pp. 1-9).

Kurosawa, Naoki, et al., "Sampling Clock Jitter Effects in Digital-to-Analog Converters", Elsevier Science Ltd. 2002, Measurement 31 (2002), PII: S0263-2241(01)00028-8, (pp. 187-199).

* cited by examiner

CREATION OF SUB-SAMPLE DELAYS IN DIGITAL AUDIO

An embodiment of the invention relates to electronic audio signal processing and in particular to techniques for obtaining sub-sample delays between two or more digital audio channels. Other embodiments are also described.

BACKGROUND

Some audio digital signal processing (DSP) algorithms require audio signals to be delayed by less than an audio sample period. This is known as sub-sample delay. In a multichannel audio system, these algorithms may require different sub-sample delays on a per channel basis. Typically, this is accomplished within the DSP calculations, by passing the signals through special finite impulse response (FIR) filters. The resulting multi-channel output data (showing different sub-sample delays between its channels) is then sent to a set of digital-to-analog converters (DACs) that all run in a synchronized fashion, driven by identical master clocks and sample clocks. The resulting analog signals are then fed to drive a loudspeaker system. This approach has the disadvantage that the FIR filter introduces unwanted side effects into the signal, namely, ripple. A large (many taps) FIR filter will reduce the side effects but will require significant DSP resources, and so this forces trade-offs to be made between audio signal quality and DSP resources.

SUMMARY

Several ways that per-channel sub-sample delays could be accomplished that need not rely on FIR fitters are described. These techniques may not just save DSP resources but also could avoid FIR filtering side effects in audio systems.

In one embodiment, several digital to analog converter (DAC) integrated circuits (ICs) are operated in parallel, receiving multiple digital audio channel signals, respectively. The DAC ICs have programmable phase offsets. The sample clock fed to each DAC can be offset in time, by some fraction of a sample period, using a variable clock circuit that is supplying the sample clocks to the DACs. This offset or fraction (also referred to as "delay") is programmable, and can be set as required by the audio processing algorithm that is being implemented. Each DAC may be a single-channel converter, and two or more of such single-channel converters are needed in order to allow every channel to have to have an independent sub-sample delay setting.

In another embodiment, per-channel sub-sample delays are achieved using single-channel oversampling DACs. A per-channel, programmable digital delay element is added to the oversampling DAC. The DAC operates at an oversampling rate. The granularity of the sub-sample delay in this case may be no finer than the oversampling rate.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
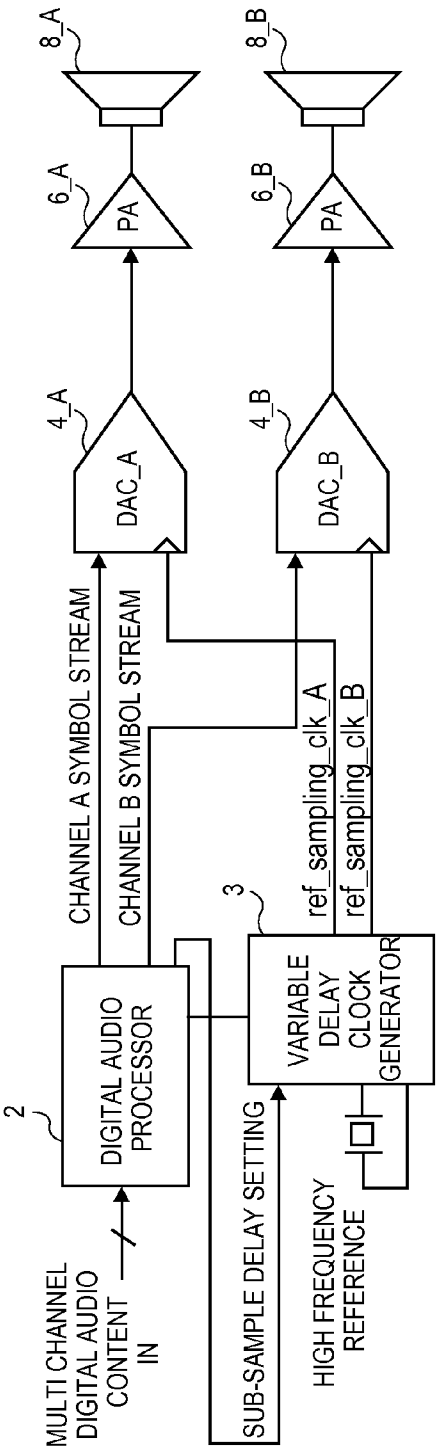
FIG. 1 is a block diagram of part of a multi-channel audio system in which a variable sub-sample delay can be set as between at least two audio channels.

FIG. 1 is a block diagram of part of a multi-channel audio system in which sub-sample delays can be set between two or more audio channels. This system can provide a variable sub-sample delay between two or more digital audio channels, where this sub-sample delay will then be reflected in the respective analog forms at the output of the DACs 4. For purposes of easier understanding, only two channels A, B are shown. As will become clear however, one of ordinary skill in the art will be able to expand the concept to more than two channels, including the ability to provide sub-sample delay settings between any two of the available channels. The system in this example has a first DAC 4_*a* that receives digital audio channel A symbol stream and converts it into analog form, using an input sampling clock signal, ref_sampling_clk_a. Similarly, a second DAC 4_*b* converts a channel B symbol stream into analog form, this time using a second input sampling clock signal, ref_sampling_clk_b. Each symbol can be an N-bit number that represents an audio sample, where, for example, N is an integer between ten (10) and thirty-two (32). Currently, 24-bit digital audio is popular in consumer electronics.

Each sampling clock signal may be used by its respective DAC 4, to sequentially latch the symbols in its respective input stream, e.g., on the rising of each clock cycle. In one embodiment, both channel A and channel B streams have the same sample rate, e.g. between 30 kHz and 300 kHz, where a currently popular sample rate in consumer electronics is 48 kHz. The sampling clocks clk_a and clk_b have essentially the same fundamental frequency as the sample rate or the rate at which the symbols are driven into each DAC 4. Accordingly, the sampling clocks should be generated to be in sync with the symbol streams that are being produced by a digital audio processor 2.

A variable delay clock generator 3 may be provided, to produce the sampling clocks clk_a, clk_b. In particular, the clock generator 3 (as well as the audio processor 2) may use a high frequency oscillatory reference, to produce the sampling clocks and control the timing of the symbol streams that are input to the DACs 4. The generator 3 can generate the clocks clk_a, clk_b so as to have the same frequency but different phase, and is able to vary the phase difference between the clocks in accordance with a sub-sample delay setting received at its control input. The delay setting may be computed and provided by the digital audio processor 2, as a digital control word. The variable delay clock generator 3 may be implemented using combinational logic and flip-flops.

Figure 2:
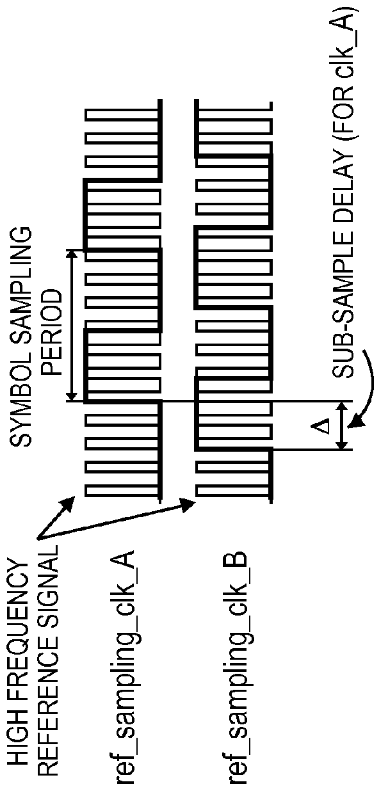
FIG. 2 is a timing diagram of example reference sampling clocks bearing an offset or relative delay.

FIG. 2 shows an example timing diagram, where the sampling clocks clk_a, clk_b have the same fundamental frequency but different phase, defined by a sub-sample delay (delta symbol). The sub-sample delay is a fractional delay in that it is a fraction of (or is generally smaller than) the symbol sampling period or the period of the ref_sampling_ clk_a, clk_b signals. The high frequency oscillatory reference used by the clock generator 3 should be selected to have a sufficiently higher frequency than the frequency of the sampling clocks, because the resolution of the obtainable sub-sample delay may be proportional to the frequency of the oscillatory reference. Thus, for example, if the input reference high frequency oscillatory signal has K times higher frequency than the sampling clock signals, the variable sub-sample delay that can produced by the generator 3 may have a resolution of no better than about 1/K of a symbol sampling period.

Each instance of the sub-sample delay setting may be computed by the digital audio processor 2, while performing a digital audio processing algorithm upon the digital audio channels A, B. In one embodiment, the digital audio processing algorithm is a beam forming or spatial filtering algorithm that computes the sub-sample delay setting so as to obtain a desired directional or spatially selected emission of sound from speakers 8_*a*, 8_*b*, while the latter are being driven by their respective power amplifiers 6_*a*, 6_*b* whose inputs receive the analog forms of the audio channels A, B, respectively. As part of the audio processing algorithm, the digital audio processor 2 may also set an overall or full band gain of each channel A, B independently, in order to further the goals of the spatial filtering.

FIG. 1 described above is one particular implementation in which a method or process for multi-channel digital audio processing can be performed, in which variable sub-sample delay can be obtained in the resulting analog forms of the input audio channels. More generally, the process converts at least two digital audio channels into analog form, using respective sampling clock signals for the digital-to-analog conversion operations whose phase difference can be changed deterministically, in accordance with a sub-sample delay setting that has been computed to further the goals of a desired audio processing algorithm. In one example, the sampling clocks have the same frequency but have variable phase difference, where the phase difference or relative sub-sample delay can be set to, for example, an integer multiple of the period of an input reference high frequency oscillatory signal (being of a higher frequency then the sampling clock signals).

Figure 3:
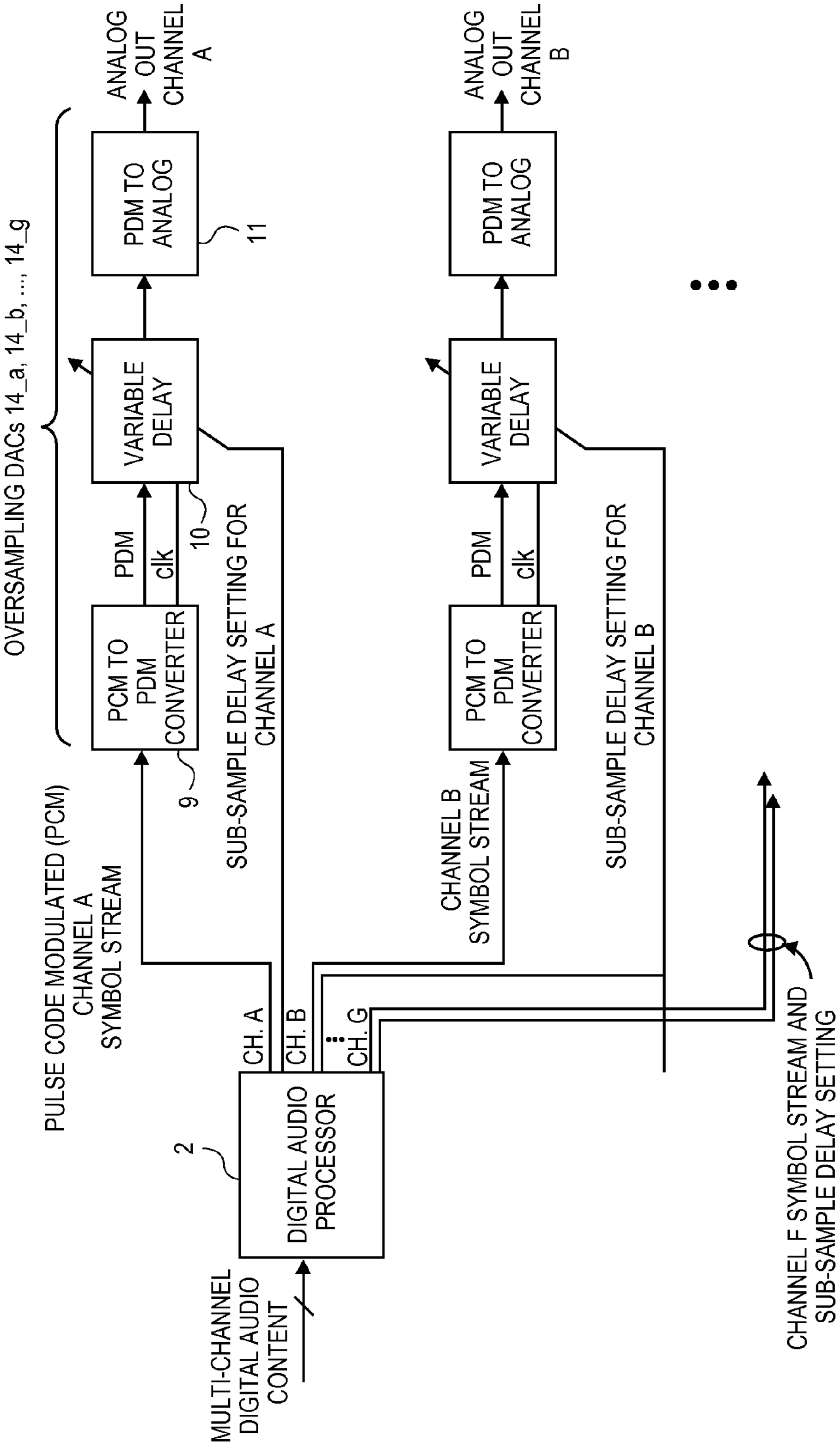
FIG. 3 is a block diagram of another multi-channel audio system in which sub-sample delays between two or more audio channels can be set.

Turning now to FIG. 3, a block diagram of another multi-channel audio system in which sub-sample delays between two or more audio channels can be set is shown. In this embodiment, a programmable digital variable delay block or element 10 is added to each oversampling DAC 14_*a*, 14_*b*, . . . . Each oversampling DAC 14 contains a pulse code modulation (PCM) to pulse density modulation (PDM) converter 9, followed by the variable delay element 10, which is then followed by a PDM to analog converter 11. The PCM to PDM converter 9 may be viewed as essentially a circuit that can increase the sample rate of the incoming audio channel symbol stream by a relatively large factor, while at the same time reducing the symbol length (e.g., from 24-bits/symbol to just one.) The PDM to analog converter 11 may be a simple low pass filter or another circuit that can average out the delayed PDM stream. The variable delay element 10 may be a digitally controllable delay block that can delay its input binary signal by a selectable, integer number of oversampling clock periods, as specified in an input sub-sample delay setting.

The oversampling DAC 14 converts its input digital audio channel, which may be in the form of a PCM symbol stream produced by the digital audio processor 2, into analog form, by way of converting the input digital audio channel into a PDM stream that is at a much higher frequency than the incoming symbol stream's sampling rate. The DAC 14 is an oversampling DAC in the sense that, for example, if the PCM symbols are 24-bits per symbol or sample, and are being delivered at a sample rate of 48 kHz, then the 1-bit PDM stream (at the output of the converter 9) may be running at 64×48 kHz=3.072 MHz—hence the term "oversampling". Using this numerical example, the variable delay element 10 in this case may have a resolution or step size of 1/(3.072 MHz)=0.326 microseconds. Contrast that with the period of the original symbol stream's sample rate of 1/48 kHz=21 microseconds, and it can be seen that a relatively fine granularity sub-sample delay is achievable by delaying the 1-bit PDM stream. The variable delay element 10 may be implemented using any suitable arrangement of combinational logic and flip-flops as clocked by an oversampling clock signal that may be produced by the PCM to PDM converter 9 and used to synchronize its output PDM stream.

As described above, an adjustable sub-sample delay can be obtained in the system of FIG. 3, between the analog forms of the two digital audio channels A, B, by controlling the variable delay element 10 of each oversampling DAC 14_*a*, 14_*b*, . . . . The setting for each delay element 10 may be computed by the digital audio processor 2, again as part of a digital audio processing algorithm that may also otherwise process the channel A and channel B symbol streams prior to their conversion into analog form.

As described above, the block diagram of FIG. 3 is an example of a system in which a method for multi-channel digital audio processing may operate. More generally, the method involves converting a first digital audio channel (channel A) into analog form, by first converting the symbol stream of the audio channel into a PDM stream and passing the PDM stream through a variable delay block, before converting into analog form. Similarly, a second digital audio channel (channel B) is also converted into analog form in parallel with channel A, by converting the symbol stream of channel B into a PDM stream and passing that PDM stream through a second variable delay block, before conversion into analog form. In one embodiment, both channel A and channel B have the same, symbol (sample) rate, and the input latching clocks used by the PCM to PDM converter 9 in each channel are synchronized and have the same frequency as the sample rate. The variable delay blocks 10 however are clocked at a much higher oversampling rate, and are controlled so as to impart an adjustable sub-sample delay to the analog forms of the digital audio channels. As in the embodiment of FIG. 1, the digital audio processor 2 here computes the sub-sample delay setting for each channel, as well as processes the digital audio channels themselves, before conversion by the oversampling DACs 14. The resulting analog forms of the audio channels are then converted into sound by respective speakers 8_*a*, 8_*b* (not shown in FIG. 3 but similar to FIG. 1). In one example, the digital audio processor 2 performs a digital audio processing algorithm such as beam forming or spatial filtering that can compute a separate sub-sample delay setting for each channel, in order to obtain desired directional or spatially selected sound emission from the speakers 8_*a*, 8_*b*.

Figure 4:
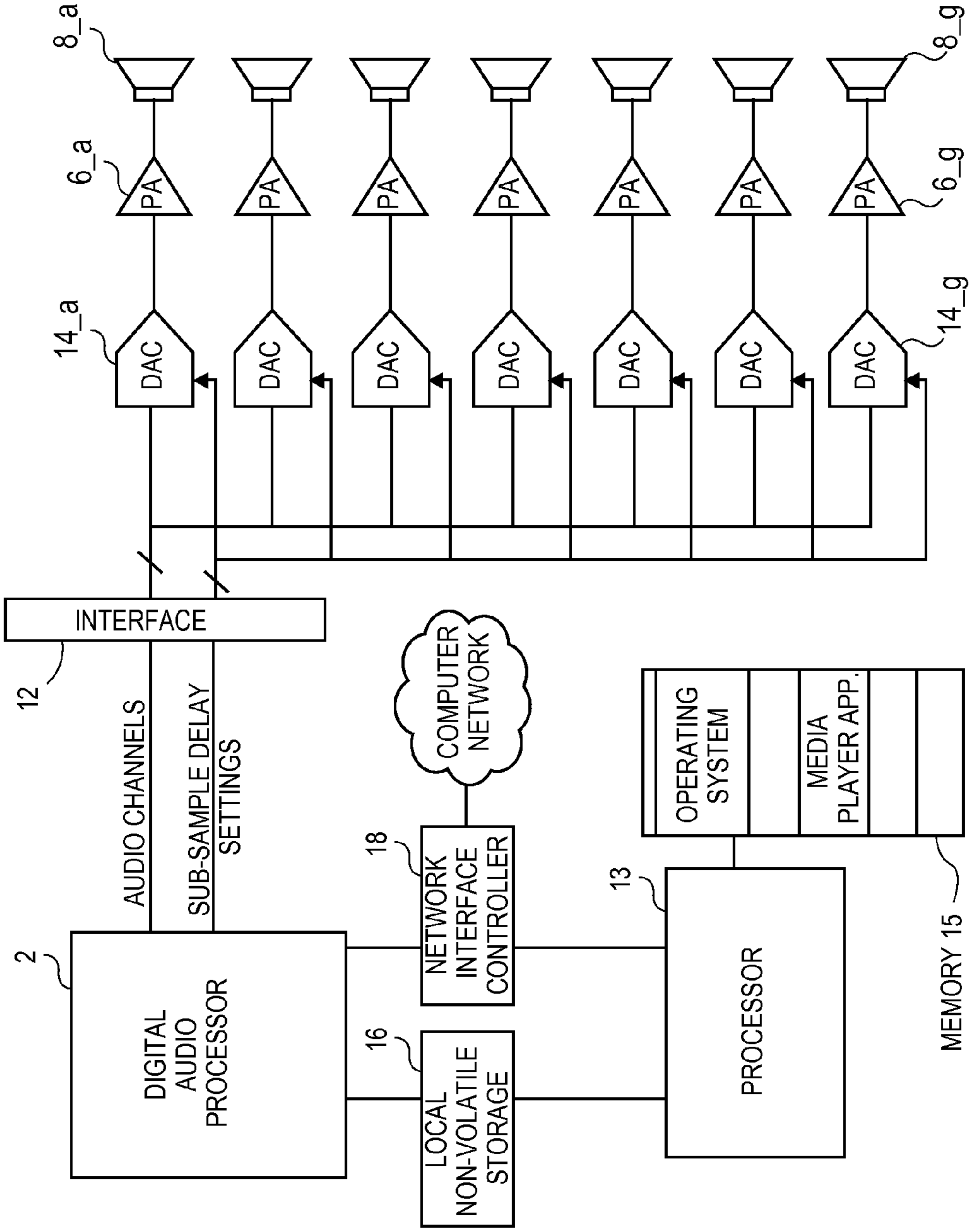
FIG. 4 is a block diagram of a multi-channel audio system as part of a consumer electronics product.

FIG. 4 is a block diagram of a multi-channel audio system as part of a consumer electronics product. The consumer electronics product has an array of speakers 8_*a*, 8_*b*, . . . 8_*g* (in this case, seven speakers) that are driven by their respective power amplifiers 6_*a*, 6_*b*, . . . 6_*g*, which are fed with analog audio channels converted by DACs 14. In this case, each DAC 14 receives its input digital audio channel symbol stream from an interface 12, in addition to the sub-sample delay setting for each channel. The interface 12 may be a wired or wireless interface that supports multi-channel digital audio, e.g., high definition multimedia interface (HDMI), multichannel audio digital interface (MADI) or audio engineering society AES-10. The elements to the right of interface 12, including interface 12, may be part of a standalone, self-powered speaker array. The elements to the left of the interface 12 may be part of a source device such as a desktop computer, a laptop computer, a tablet computer, or a smart phone. The housing of the source device (not shown) may have integrated therein the following elements: digital audio processor 2; a local non-volatile data storage 16 in which audio or movie files may be stored; a network interface controller 18 that connects the source device to a computer network; and a processor 13 such as an applications processor, a system on a chip (SoC) or a central processing unit (CPU) that executes an operating system and a number of application programs which are stored in a memory 15.

The processor 13 could execute the media player application and thereby access a remote computer through the network interface controller 18, and then begin streaming of a motion picture or music file. Alternatively, the file may be stored in the local non-volatile data storage 16. In both cases, the digital audio processor 2 may be configured to perform an audio processing algorithm upon the audio portion of the file, e.g., in the case of 5.1 Surround Sound, at least six audio channels are decoded from a movie file, and in most stereo music files two audio channels are decoded. The digital audio processor 2 may be running a beam forming or spatial filtering algorithm, or other sound enhancing algorithm, that processes the decoded audio channels into digital channels A, B, . . . G (in this case seven digital channels), in order to interface with the standalone speaker array in which seven independently controllable speaker channels are available. In so doing, the digital audio processor 2 may compute up to seven sub-sample delay settings, one for each of the speakers 8 (because it "knows" those are available through the interface 12), and sends those delay settings together with the content in the seven audio channels to the interface 12. These audio channels and delay settings are received in the speaker array side of the interface 12 and then distributed to the individual DACs 14_*a*, 14_*b*, . . . for conversion into analog form and then into sound. As a result, a spatially filtered (or otherwise improved) sound is emitted, by the speakers 8. The availability of the sub-sample delay settings and the fact that they are controllable for each channel enables a finer control of the spatial filtering, thereby producing a more accurate sound emission pattern.

It should be noted that while FIG. 4 depicts an example consumer electronics product in which the speaker array is driven by a bank of oversampling DACs 14, an alternative may be to use the approach depicted in FIG. 1 where a bank of "regular" DACs 4 are used (one per channel) together with the variable clock generator 3 receiving the sub-sample delay settings. In that case, the arrangement in FIG. 1 may be incorporated into the block diagram of FIG. 4, expanded from two channels to seven channels. In that case, there will be seven DACs 4_*a*, 4_*b*, . . . 4_*g*, and a variable delay clock generator 3 that has not two outputs but rather seven reference sampling clock outputs a, b, . . . g, and that may respond to up to seven sub-sample delay settings computed by the digital audio processor 2.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, while FIG. 3 illustrates the oversampling DAC solution using as an example the channel A and channel B symbol streams being PCM encoded, an alternative is to deliver the symbol streams in another encoding format such as pulse width modulation (PWM). The description is thus to be regarded as illustrative instead of limiting.

What is claimed is:

1. A multi-channel audio system that can provide a variable sub-sample delay between two audio channels, comprising:

a first digital to analog converter (DAC) to convert a first digital audio channel into analog form using a first clock signal, wherein the first digital audio channel comprises a sequence of symbols driven at a sample rate, and wherein each symbol is to be latched in the first DAC by the first clock signal at the sample rate;

a second DAC to convert a second digital audio channel into analog form using a second clock signal, wherein the second digital audio channel comprises a sequence of symbols driven at the sample rate and wherein each symbol is to be latched in the second DAC by the second clock signal at the sample rate; and a variable timing clock generator to generate the first and second clock signals having different phase, wherein the clock generator is to vary the phase difference between the first and second clock signals in accordance with a sub-sample delay setting input.

2. The system of claim 1 wherein the variable timing clock generator is to receive an input reference oscillatory signal and generate therefrom the first and second clock signals having the same frequency but different phase.

3. The system of claim 2 wherein the input reference oscillatory signal has a higher frequency than the frequency of the clock signals.

4. The system of claim 3 wherein the input reference oscillatory signal has at least four (4) times higher frequency than the clock signals.

5. The system of claim 1 further comprising:

a digital audio processor that is to perform a digital audio processing algorithm upon the first and second digital audio channels prior to conversion by the first and second DACs, and is to compute the sub-sample delay setting; and first and second speakers that are coupled to be driven by the analog forms of the first and second digital audio channels.

6. The system of claim 1 further comprising:

a processing system which includes a processor;

a network interface controller coupled to the processing system, the network interface controller configured to receive streaming content;

a memory coupled to the processing system;

a media player application stored in the memory.

7. The system of claim 6 wherein the streaming content is one of a motion picture or music.

8. The system of claim 5 wherein the digital audio processing algorithm is a beam forming or spatial filtering algorithm that computes the sub-sample delay setting to obtain a desired directional or spatially selective sound emission from the speakers.

9. A multi-channel audio system that can provide a variable sub-sample delay between two audio channels, comprising:

a first oversampling digital to analog converter (DAC) to convert a first digital audio channel into analog form by way of converting the first digital audio channel into a pulse density modulation (PDM) stream and then into analog form, the first oversampling DAC having a first delay block through which the PDM stream passes before being converted into analog form; and a second oversampling DAC to convert a second digital audio channel into analog form by way of converting the second digital audio channel into a PDM stream and then into analog form, the second oversampling DAC having a second delay block through which the PDM stream passes before being converted into analog form, wherein the first and second delay blocks are controllable so as to impart an adjustable sub-sample delay between the analog forms of the two digital audio channels.

10. The system of claim 9 wherein the first digital audio channel contains a sequence of symbols driven at a sample rate that is lower than an oversampling sample rate of the PDM stream.

11. The system of claim 9 wherein granularity of the adjustable sub-sample delay is no finer than the oversampling rate.

12. The system of claim 10 wherein the PDM streams are 1-bit streams.

13. The system of claim 9 further comprising:

a digital audio processor that is to perform a digital audio processing algorithm upon the first and second digital audio channels prior to conversion by the first and second DACs, and is coupled to the first and second delay blocks to generate control signals for setting the adjustable sub-sample delay; and first and second speakers that are coupled to be driven by the analog forms of the first and second digital audio channels.

14. The system of claim 13 wherein the digital audio processing algorithm is a beam forming or spatial filtering algorithm that computes the control signals to produce desired directional or spatially selective sound emission from the speakers.

15. The system of claim 9 further comprising;

a processing system which includes a processor;

a network interface controller coupled to the processing system, the network interface controller configured to receive streaming content;

a memory coupled to the processing system;

a media player application stored in the memory.

16. The system of claim 15 wherein the streaming content is one of a motion picture or music.

17. A method for multi-channel digital audio processing, comprising:

converting a first digital audio channel into analog form using a first clock signal, wherein the first digital audio channel comprises a first sequence of symbols driven at a sample rate, and wherein each symbol of the first sequence is latched during the conversion in accordance with first clock signal at the sample rate;

converting a second digital audio channel into analog form using a second clock signal, wherein the second digital audio channel comprises a second sequence of symbols driven at the sample rate and wherein each symbol of the second sequence is latched during the conversion accordance with the second clock signal at the sample rate; and changing a phase difference between the first and second clock signals in accordance with a sub-sample delay setting.

18. The method of claim 17 further comprising generating the first and second clock signals as having the same frequency but variable phase difference, from an input reference oscillatory signal that is of a higher frequency than the clock signals.

19. The method of claim 17 further comprising:

performing a digital audio processing algorithm to generate the sub-sample delay setting and to process the first and second digital audio channels prior to said conversion; and converting analog forms of the first and second digital audio channels into sound.

20. The method of claim 19 wherein the digital audio processing algorithm is a beam forming or spatial filtering algorithm that computes the sub-sample delay setting for a desired directional or spatially selective sound emission.

21. A method for multi-channel digital audio processing, comprising:

converting a first digital audio channel into analog form, by converting the first digital audio channel into a pulse density modulation (PDM) stream and passing the PDM stream through a first delay block before converting into analog form, wherein the first digital audio channel contains a sequence of symbols driven at a sample rate that is lower than an oversampling sample rate of the PDM stream;

converting a second digital audio channel into analog form, by converting the second digital audio channel into a pulse density modulation (PDM) stream and passing the PDM stream through a second delay block before converting into analog form; and controlling the first and second delay blocks so as to impart an adjustable sub-sample delay between the analog forms of the two digital audio channels.

22. The method of claim 21 wherein granularity of the adjustable sub-sample delay is no finer than the oversampling rate.

23. The method of claim 22 wherein the PDM streams are 1-bit streams.

24. The method of claim 21 further comprising:

performing a digital audio processing algorithm to compute a sub-sample delay setting and to process the first and second digital audio channels prior to said conversion; and converting analog forms of the first and second digital audio channels into sound.

25. The method of claim 24 wherein the digital audio processing algorithm is a beam forming or spatial filtering algorithm that computes the sub-sample delay setting to obtain desired directional or spatially selective sound emission.

26. A non-transitory machine readable medium storing instructions which, when executed by a processing system, causes the processing system to perform a method for multi-channel digital audio processing, the method comprising:

converting a first digital audio channel into analog form using a first clock signal, wherein the first digital audio channel comprises a first sequence of symbols driven at a sample rate, and wherein each symbol of the first sequence is hatched during the conversion in accordance with the first clock signal at the sample rate;

converting a second digital audio channel into analog form using a second clock signal, wherein the second digital audio channel comprises a second sequence of symbols driven at the sample rate and wherein each symbol of the second sequence is latched during the conversion in accordance with the second clock signal at the sample rate; and changing a phase difference between the first and second clock signals in accordance with a sub-sample delay setting.

27. The medium of claim 26, the method further comprising generating the first and second clock signals as having the same frequency but variable phase difference, from an input reference oscillatory signal that is of a higher frequency than the clock signals.

28. The medium of claim 26, the method further comprising:

performing a digital audio processing algorithm to generate the sub-sample delay setting and to process the first and second digital audio channels prior to said conversion; and converting analog forms of the first and second digital audio channels into sound.

29. The medium of claim 28, wherein the digital audio processing algorithm is a beam forming or spatial filtering algorithm that computes the sub-sample delay setting for a desired directional or spatially selective sound emission.

30. A non-transitory machine readable medium storing instructions which, when executed by a processing system, causes the processing system to perform a method for multi-channel digital audio processing, the method comprising:

converting a first digital audio channel into analog form, by converting the first digital audio channel into a pulse density modulation (PDM) stream and passing the PDM stream through a first delay block before converting into analog form, wherein the first digital audio channel contains a sequence of symbols driven at a sample rate that is lower than an oversampling sample rate of the PDM stream;

converting a second digital audio channel into analog form, by converting the second digital audio channel into a pulse density modulation (PDM) stream and passing the PDM stream through a second delay block before converting into analog form: and controlling the first and second delay blocks so as to impart an adjustable sub-sample delay between the analog forms of the two digital audio channels.

31. The medium of claim 30 wherein granularity of the adjustable sub-sample delay is no finer than the oversampling rate.

32. The medium of claim 31 wherein the PDM streams are 1-bit streams.

33. The medium of claim 30, the method further comprising:

performing a digital audio processing algorithm to compute a sub-sample delay setting and to process the first and second digital audio channels prior to said conversion; and converting analog forms of the first and second digital audio channels into sound.

34. The medium of claim 33 wherein the digital audio processing algorithm is a beam forming or spatial filtering algorithm that computes the sub-sample delay setting to obtain desired directional or spatially selective sound emission.

35. A digital audio processing system, comprising:

means for converting a first digital audio channel into analog form using a first clock signal, wherein the first digital audio channel comprises a first sequence of symbols driven at a sample rate, and wherein each symbol of the first sequence is latched during the conversion in accordance with the first clock signal at the sample rate;

means for converting a second digital audio channel into analog form using a second clock signal, wherein the second digital audio channel comprises a second sequence of symbols driven at the sample rate and wherein each symbol of the second sequence is latched during the conversion in accordance with the second clock signal at the sample rate; and means for changing a phase difference between the first and second clock signals in accordance with a sub-sample delay setting.

36. The system of claim 35 further comprising means for generating the first and second clock signals as having the same frequency but variable phase difference, from an input reference oscillatory signal that is of a higher frequency than the clock signals.

37. The system of claim 35 further comprising:

means for performing a digital audio processing algorithm to generate the sub-sample delay setting and to process the first and second digital audio channels prior to said conversion; and means for converting analog forms of the first and second digital audio channels into sound.

38. The system of claim 37 wherein the digital audio processing algorithm is a beam forming or spatial filtering algorithm that computes the sub-sample delay setting for a desired directional or spatially selective sound emission.

39. A digital audio processing system, comprising:

means for converting a first digital audio channel into analog form, by converting the first digital audio channel into a pulse density modulation (PDM) stream and passing the PDM stream through a first delay block before converting into analog form, wherein the first digital audio channel contains a sequence of symbols driven at a sample rate that is lower than an oversampling sample rate of the PDM stream;

means for converting a second digital audio channel into analog form, by converting the second digital audio channel into a pulse density modulation (PDM) stream and passing the PDM stream through a second delay block before converting into analog form; and means for controlling the first and second delay blocks so as to impart an adjustable sub-sample delay between the analog forms of the two digital audio channels.

40. The system of claim 37 wherein granularity of the adjustable sub-sample delay is no finer than the oversampling rate.

41. The system of claim 40 wherein the PDM streams are 1-bit streams.

42. The system of claim 39 further comprising:

means for performing a digital audio processing algorithm to compute a sub-sample delay setting and to process the first and second digital audio channels prior to said conversion; and means for converting analog forms of the first and second digital audio channels into sound.

43. The system of claim 42 wherein the digital audio processing algorithm is a beam forming or spatial filtering algorithm that computes the sub-sample delay setting to obtain desired directional or spatially selective sound emission.

* * * * *